United States Patent [19]

Diaz

[11] 4,236,774

[45] Dec. 2, 1980

[54] ELECTRONIC APPARATUS CABINET ASSEMBLY

[75] Inventor: Raul Diaz, Baltimore, Md.

[73] Assignee: Norlin Industries, Inc., Deerfield, Ill.

[21] Appl. No.: 24,508

[22] Filed: Mar. 28, 1979

[51] Int. Cl.³ .................... A47B 81/06; H05K 5/00
[52] U.S. Cl. .................................. 312/351; 312/270; 312/330; 361/390
[58] Field of Search ............... 312/242, 270, 296, 330, 312/333, 351; 361/380, 386, 390, 427

[56] References Cited

U.S. PATENT DOCUMENTS

| | | | |
|---|---|---|---|
| 2,478,470 | 8/1949 | Eastman et al. | 312/296 UX |
| 3,883,206 | 5/1975 | Baughman | 312/351 |
| 4,120,545 | 10/1978 | Happak et al. | 312/330 R |

Primary Examiner—Casmir A. Nunberg
Attorney, Agent, or Firm—Jack Kail; Ronald J. Kransdorf

[57] ABSTRACT

An electronic apparatus cabinet assembly comprises a generally U-shaped extrusion having an interior mounting rail disposed near an open end thereof and a deck member secured between the legs of the extrusion. An RFI sealing material is disposed overlying the mounting rail which receives a lid member having dimensions slightly smaller than the open end of the extrusion. Upon forcing the lid member into compression against the sealing material and mounting rail, some of the sealing material is forced upward from the interstice between the lid member and the extrusion forming a joint having a high integrity RFI seal.

5 Claims, 3 Drawing Figures

ELECTRONIC APPARATUS CABINET ASSEMBLY

BACKGROUND OF THE INVENTION

The present invention relates to cabinet assemblies for housing electronic apparatus or the like and, more particularly, to such cabinet assemblies and methods for forming the assemblies which are characterized by high integrity radio frequency interference seals and improved structural strength.

Electronic equipment of various sorts is frequently assembled in a modular form wherein a typically box-like cabinet assembly is constructed for receiving one or more individual electronic sub-assemblies. The cabinet assemblies may, in turn, be housed within a larger chassis or may be utilized in a stand-along mode. In either case, the electronic sub-assemblies are often contained on printed circuit boards which include suitable mounting apparatus enabling the boards to be easily inserted or removed from the cabinet assemblies as the need arises. This modular arrangement facilitates logistical operations associated with maintaining the equipment in that, for example, repair operations, including stock piling of spare parts, may be performed on a sub-assembly basis by relatively inexperienced maintenance personnel in a minimum period of time. These latter considerations largely account for the recent popularity of such modularized electronic equipment.

Due to the nature of electronic equipment, and especially particular apparatus such as radio receivers and transmitters, the cabinet assemblies preferably supply an operational environment secure from radio frequency interference (RFI). If allowed to exceed certain levels, radio frequency interference permeating the cabinet assembly from an external source can seriously degrade the performance of the electronic sub-assemblies by subjecting them to excessive levels of noise. On the other hand, radiation of radio frequency interference from within the cabinet assembly can adversely affect the performance of other nearby equipment. To avoid these problems, most military agencies, for example, provide strict specifications defining precise limits of radio frequency interference to which various types of equipment may be subjected as well as to maximum permissible levels of radiation.

One technique commonly used to decrease the radio frequency interference susceptibility of cabinet assemblies adapted for housing electronic apparatus is to secure the various joints of the cabinets with special radio frequency interference shielding materials. These shielding materials, an exemplary form of which may comprise a strip of silicone rubber impregnated with wire fibers or the like, are normally glued to one or more surfaces of the cabinet assembly to seal the joints for preventing externally generated radio frequency interference from exposing and interfering with the electronic equipment contained within the cabinet and for preventing internally generated radio frequency interference from radiating outwardly from the cabinet. While such prior art efforts have been successful to a degree, they have not always reduced radio frequency interference leakage to an acceptable level in a manner which is conveniently and cost effectively implemented.

In addition to providing adequate radio frequency interference shielding, the cabinet assembly is also preferably relatively light-weight and inexpensively manufacturable while, at the same time, possessing adequate structural strength. These requirement have heretofore been considered to be somewhat conflicting and have not been fully satisfied by any known prior art cabinet assembly useful for housing electronic apparatus.

SUMMARY OF THE INVENTION

In view of the foregoing, it is a basic object of the invention to provide a new and useful cabinet assembly for housing electronic sub-assemblies.

It is a further object of the invention to provide such a cabinet assembly which is characterized by high integrity radio frequency interference seals.

Yet another object of the invention is to provide a cabinet assembly of the foregoing type which is conveniently and inexpensively manufactured and which is relatively light-weight and yet possesses a high degree of structural strength.

In accordance with these and other useful objects, the cabinet assembly of the present invention comprises an extrusion having a pair of opposed upstanding side walls and an upstanding end wall extending transversely between the side walls. A deck member is secured between the side and end walls near the bottom of the extrusion for supporting an item of electronic apparatus. A lid member is provided for enclosing the open top end of the extrusion and is characterized by a configuration substantially conforming to but slightly smaller than the dimensions thereof. A mounting rail comprising a transverse flange formed integrally with the extrusion extends interiorally about the side and end walls near the top end of the extrusion and is adapted for supporting the lid member. Finally, a flexible radio frequency interference sealing material is disposed overlying the mounting rail.

In the assembly of the cabinet, the lid member is forced into compression against the mounting rail and sealing material leaving a slight intersticial area between the surfaces of the side and end walls and the lid member. The radio frequency inteference sealing material is forced upwards from the intersticial area and may slightly overlay portions of the top surface of the lid member as well as portions of the exterior surfaces of the end and side walls. The seals thereby formed provide a high degree of radio frequency interference integrity wherein radiation must follow a rather tortuous path to be either radiated from or into the cabinet assembly through the joints thereof. A similar lid member may also be used to secure the bottom end of the extrusion.

The deck member is characterized by a double bend configuration at its front edge which, together with the extrusion, form a structurally sound configuration while utilizing a minimum degree of metal thereby reducing the weight of the assembly.

DESCRIPTION OF THE PREFERRED EMBODIMENT

Figure 1:
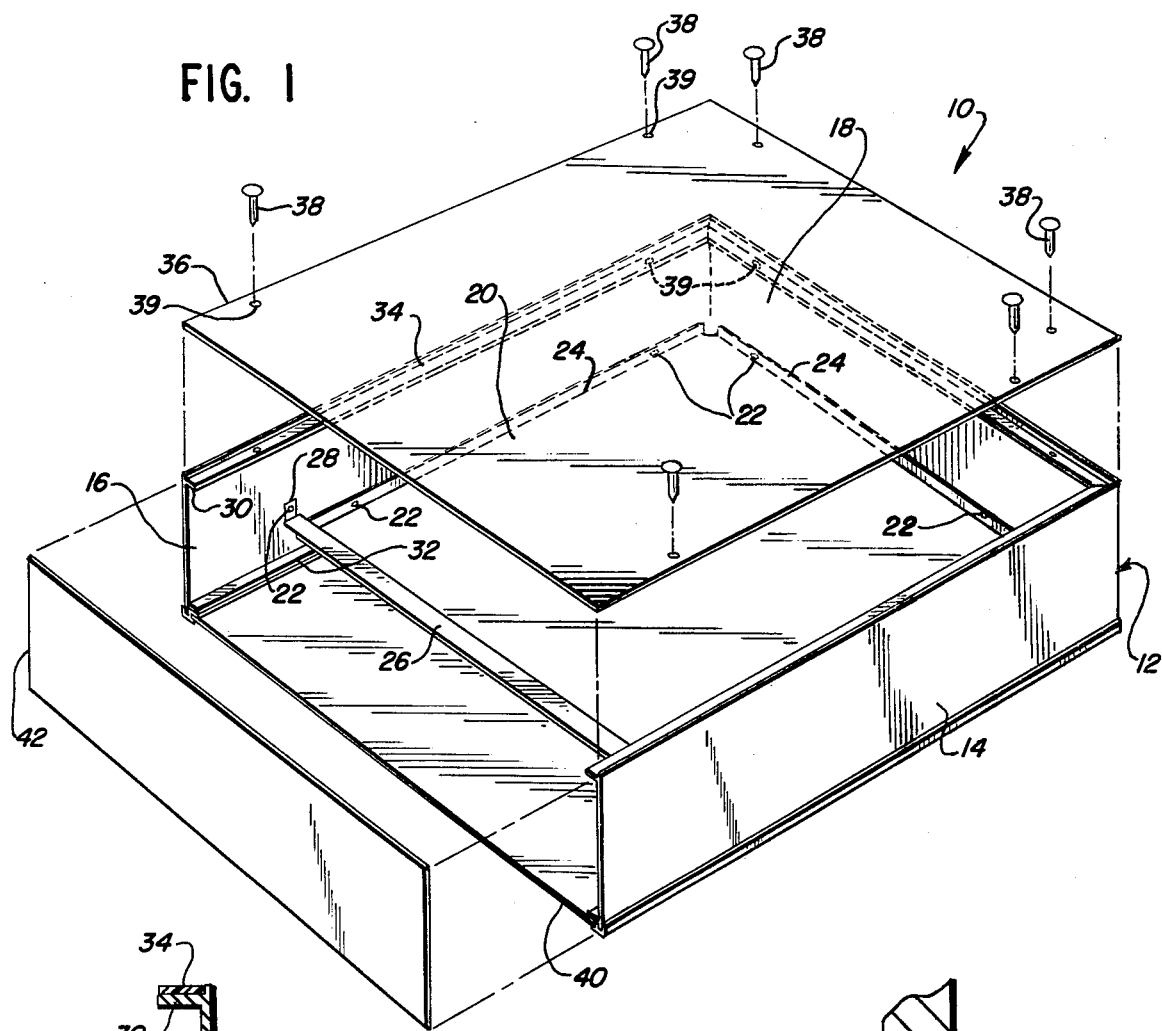
FIG. 1 is a perspective view, partly in exploded form, showing the cabinet assembly of the present invention.

Referring now to the drawings, and in particular, to FIG. 1, the cabinet assembly of the invention, identified generally by reference numeral 10, comprises a one-piece generally U-shaped extrusion 12 having a pair of opposed upstanding side walls 14 and 16 and a transversely extending end wall 18. A deck member 20 is disposed between the side and end walls 14, 16 and 18 and adapted for supporting an electronic sub-assembly within cabinet assembly 10. The deck member 20 includes three upstanding flanges 24 each abutting one of the walls 14, 16, and 18. Conventional means such as screws 22 or the like secure deck member 20 within cabinet assembly 10 by appropriately fastening each of the flanges 24 to its respective wall 14, 16 and 18 to provide increased stress distribution between the members. Also, good thermal contact is thereby established between the members which facilitates heat dissipation throughout the assembly. The front-most edge 26 of deck member 20 is formed having a double bend adding structural strength to the deck without utilizing additional metal. A pair of tabs 28 extend from the distal ends of front edge 26 in abutment with side walls 14 and 16. Screws 22 fasten tabs 28 to the side walls as previously described.

A mounting rail or flange 30, comprising a portion of the extrusion making up side and end walls 14, 16 and 18, extends transversely from and interiorally of the side and end walls 14, 16 and 18. Mounting rail 30, which is disposed slightly below the upper end of cabinet assembly 10, thusly extends completely about the interior surfaces of walls 14, 16 and 18 forming a generally U-shaped interior mounting structure. A similar mounting rail 32 is disposed slightly above the bottom end of assembly 10 forming a second U-shaped interior mounting structure.

Figure 2:
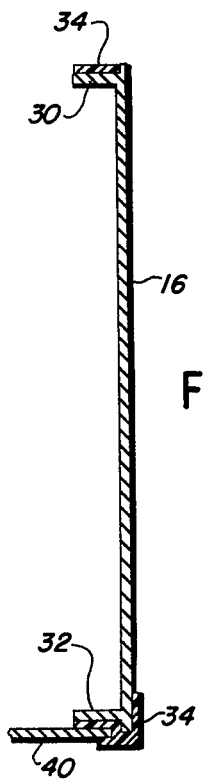
FIG. 2 is a cross-sectional view taken along line 2—2 of FIG. 1.

Referring now to FIG. 2, a flexible radio frequency interference sealing material 34 is disposed completely overlying the entire extent of mounting rail 30. Sealing material 34 may comprise, for example, a strip of silicone rubber impregnated with wire fiber. Such material is well-known in the industry and may be obtained from various sources.

The top end of the assembly 10 is closed by a generally flat lid member 36 which has a configuration substantially conforming to the shape of the top end of assembly 10. The dimensions of lid member 36, however, are slightly less than the corresponding dimensions of the top end of assembly 20 such that when the lid member is seated on mounting rail 30 a small intersticial area is formed between the lid and the interior side surfaces of the side and end walls 14, 16 and 18. It will be noted that this intersticial area leaves exposed a small portion of the sealing material 34 disposed over mounting rail 30. Upon forcing lid member 36 into compression with mounting rail 30, the sealing material is forced upward from the intersticial area forming a narrow layer partly overlying the top surface of lid member 36 and the outside surfaces of walls 14, 16 and 18. The sealing material 34, under compression from lid member 36, digs into the metallic members forming an electrical bond which, in association with the labyrinth type seal, forms a highly stable and secure radio frequency interference seal. In particular, electro-magnetic radiations eminating from the interior of cabinet assembly 10 must pass along a path making at least two right angles before radiating from the joint formed between lid member 36 and extrusion 12. Similarly, electromagnetic radiations eminating from outside cabinet assembly 10 must follow a path including at least two right angles in order to penetrate this seal.

Lid member 36 may be secured to extrusion 12 by means of suitable screws 38 passing through aligned apertures 39 in the lid and in the mounting rail 30. When so secured, the lid member 36 serves as a stress bearing member and also functions as a dust cover and provides electro-status shielding for the electronic equipment disposed within the cabinet assembly 10.

Figure 3:
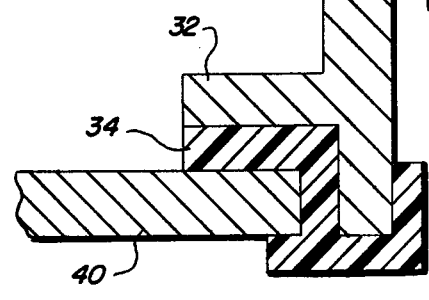
FIG. 3 is an enlarged view of a portion of the cross-sectional view shown in FIG. 2.

A bottom plate 40, constructed identically with lid member 36, is secured to bottom mounting rail or flange 32 in a manner identical to that previously described with respect to the lid member. FIG. 3 shows an enlarged view of the seal formed by the material 34. It will be observed that the sealing material 34 is disposed between mounting rail 32 and bottom plate 40, extends downwardly from the intersticial area between the walls 14, 16 and 18 and bottom plate 40 and then partially overlies a portion of the bottom surface of bottom plate 40 and a portion of the outer surface of the extrusion walls.

Referring back to FIG. 1, a front panel 42 is secured across the opened front end of extrusion 12 and serves as a stress bearing member which adds structural strength to the assembly 10.

While a particular embodiment of the invention has been shown and described, it will be obvious to those skilled in the art that changes and modifications may be made without departing from the invention in its broader aspects. For example, various other sealing materials may be used in place of the wire fiber impregnated silicone rubber described above. Therefore, the aim in the appended claims is to cover all such changes and modifications as fall within the true spirit and scope of the invention.

What is claimed is:

1. A cabinet assembly for housing electronic apparatus comprising:
    a generally U-shaped structure having a pair of opposed side walls and an end wall extending transversely therebetween, said walls coooprating for defining top and bottom ends of predetermined configuration and dimensions;
    a deck member secured between said side and end walls near the bottom end of said structure for supporting an item of electronic apparatus thereon;
    a lid member having a configuration substantially conforming to said predetermined configuration and having dimensions slightly less than said predetermined dimensions;
    a mounting rail extending interiorly about said side and end walls near the top end of said structure and adapted for supporting said lid member;
    means forcing said lid member into compression against said mounting rail; and a strip of RFI sealing material disposed between said mounting rail and said lid member and extending upwards from the interstice formed between said walls and lid member onto the top surface of said lid and the exterior surfaces of said walls for forming an RFI seal of high integrity.

2. A cabinet assembly according to claim 1 wherein said U-shaped structure and said mounting rail comprise a unitary extrusion.

3. A cabinet assembly according to claim 2 wherein said deck member comprises a generally flat plate having a double bend configuration along its edge opposite said end wall.

4. A cabinet assembly according to claim 1 wherein said sealing material comprises a strip of silicone rubber impregnated with wire fibers.

5. A method of forming a joint having high integrity RFI sealing characteristics comprising the steps of:

providing first and second conductive plates each having an interior and an exterior surface, said interior surface of said first plate having a flange extending transversely therefrom and near a free end thereof;

disposing a flexible RFI sealing material overlying said flange;

disposing said interior surface of said second plate overlying said sealing material and flange and slightly offset from said interior side of said first plate; and compressing said second plate against said sealing material and flange, whereby at least some of said sealing material is forced upward from the interstice between said first and second plates onto the exterior surfaces of said first and second plates forming a joint having a high integrity RFI seal.

* * * * *